United States Patent [19]
Richards et al.

[11] Patent Number: 5,499,373
[45] Date of Patent: Mar. 12, 1996

[54] APPARATUS AND METHODS FOR DESIGNING, ANALYZING OR SIMULATING SIGNAL PROCESSING FUNCTIONS

[75] Inventors: John W. Richards, Stockbridge; Jonathan J. Stone, Reading; Alan Turner, Basingstoke; Carl W. Walters, Reading; Mukesh Chouhan, Basingstoke; Peter Kavanagh, Guildford, all of United Kingdom

[73] Assignees: Sony Corporation, Tokyo, Japan; Sony United Kingdom Limited, Middlesex, England

[21] Appl. No.: 337,150

[22] Filed: Nov. 9, 1994

Related U.S. Application Data

[63] Continuation of Ser. No. 984,522, Dec. 2, 1992, abandoned.

[30] Foreign Application Priority Data

Dec. 10, 1991 [GB] United Kingdom .................... 9126208

[51] Int. Cl.⁶ ..................................................... G06F 15/00
[52] U.S. Cl. ..................................... 395/154; 364/DIG. 1; 364/DIG. 2; 364/920.7; 364/920.8
[58] Field of Search ..................... 364/DIG. 1 MS File, 364/DIG. 2 MS File; 395/401, 700, 155, 165, 166, 500, 118, 133, 154

[56] References Cited

U.S. PATENT DOCUMENTS

| | | | |
|---|---|---|---|
| 4,692,757 | 9/1987 | Tsuhara et al. | 340/721 |
| 4,956,806 | 9/1990 | Crowe et al. | 395/146 |
| 4,992,887 | 2/1991 | Aragaki | 358/403 |
| 5,031,121 | 7/1991 | Iwai et al. | 364/523 |

FOREIGN PATENT DOCUMENTS 2247597  3/1992  United Kingdom .

OTHER PUBLICATIONS

International Conference on Acoustics, Speech, and Signal Processing 23 May 1989, Glasgow Scotland pp. 1083–1086 Shore et al. 'an extensible file system for signal processing software' p. 1084, col. 1, Line 11–Line 24, p. 1084, col. 1, Line 43–Line 53, p. 1084, col. 1, Line 57–Line 65, p. 1084, col. 2, Line 66, p. 1085, col. 1, Line 40, p. 1085, col. 2, Line 1–Line 11; Fig. 1.

*Primary Examiner*—Robert B. Harrell
*Attorney, Agent, or Firm*—William S. Frommer; Alvin Sinderbrand

[57] ABSTRACT

Data to be processed is stored within data files 20. Associated with each data file 20 is a header file 18. The header files 18 store data specifying a wide range of attributes of the data within the data files 20. A user selects a particular signal processing function 14 that he desires to use and this then accesses one or mope selected data files 20 and associated header files 18. The selected signal processing tool 14 only needs a set of the attributes stored within the header files 18. The signal processing tool 14 reads those attributes it requires and then manipulates the data within the data file 20. The provision of this structure allows a wide range of signal processing function tools to be integrated into a single system which may also be simply expanded.

19 Claims, 4 Drawing Sheets

APPARATUS AND METHODS FOR DESIGNING, ANALYZING OR SIMULATING SIGNAL PROCESSING FUNCTIONS

This application is a continuation of application Ser. No. 07/984,522 filed Dec. 2, 1992, now abandoned.

BACKGROUND OF THE INVENTION

1. Field of the Invention

This invention relates to the field of apparatus and methods for designing, analyzing, or simulating signal processing functions.

2. Description of the Prior Art

In order to be able to work efficiently, practising engineers use specialised tools to design, analyze and simulate various signal processing functions.

Known systems for designing, analyzing or simulating signal processing functions are focused on particular areas within the broad range of signal processing functions that are possible. Examples of existing systems are:

ILS System—focuses on 1—D audio problems

Logica Lucid System—focuses 2—D and 3—D problems

Comdisco System—allows behaviourial modelling functions to be translated to a hardware realisation.

However, the work of an engineer typically requires a broad range of different signal processing function to be designed, analyzed or simulated even when working on a single project. An example of a sequence of tasks the engineer would perform is:

1). Design a 1—D finite impulse response (FIR) digital low pass filter.
2). Analyze the response of the filter graphically to ensure the performance is satisfactory.
3). Design a second 1—D low pass FIR filter.
4). Analyze the response of the second filter graphically.
5). Convolve the two 1—D filters into a 2—D filter.
6). Design a true 2—D circularly symmetric digital filter.
7). Use the filter from step 5) to filter a video image.
8). Use the filter from step 6) to filter a video image.
9). Display the results of step 7) as a 2—D picture.
10). Display the results of step 8) as a 2—D picture.
11). Take the difference of the filtered video images from step 7) and step 8).
12). Display the difference scaled by a particular factor in order to show any significant differences in processing.

None of the known systems have the required breadth or depth of features to be truly useful in providing all the necessary design, analysis or simulation possibilities that are likely to be needed when producing a complete new system as illustrated above.

SUMMARY OF THE INVENTION

Viewed from one aspect the invention provides apparatus fop designing, analyzing or simulating signal processing functions, said apparatus comprising:

(i) data file storage means for storing one or more data files to be processed;

(ii) header file storage means for storing a header file corresponding to each of said one or more data files specifying a plurality of attributes of data within each of said one or more data files;

(iii) data file selection means for selecting one of said one or more data files to undergo a signal processing function;

(iv) signal processing function selection means for selecting one of a plurality of signal processing functions to be carried out upon data within a data file; and (v) signal processing means for performing a selected signal processing function upon data within a selected data file in dependence upon a set of attributes read from a header file corresponding to said selected data file.

The invention provides a system with an architecture that enables a wide range of signal processing functions to be modelled and allows the possibility of easy extension to future areas of interest. At the heart of the system is the idea of providing a comprehensive header file for each data file thereby providing considerable flexibility in the signal processing functions that can be carried out upon the data within the data files. A given signal processing function will extract the set of attributes from the header file needed for its particular processing operation.

If it is desired to extend the system by providing a new signal processing function, then the comprehensive header file is highly likely to contain the information that the new signal processing function requires to operate. In this way new signal processing functions can be added without requiring that other parts of the system are modified.

It will be appreciated that it is particularly important to select appropriate attributes to be included within the header files. The appropriate attributes will vary depending upon the nature of the data stored in the data files.

In preferred embodiments of the invention at least one of said one or more data files is composed of digital video signal data comprising a plurality of video data elements with a corresponding header file specifying:

the spatial and temporal dimensions of said digital video signal data, the number of bytes storing each video data element, the number of bits active in storing each video data element within said video data element storing bytes, whether said digital video signal data is interlaced digital video signal data, the sampling rate in each dimension of said digital video signal data, and the number of video data elements in each dimension.

In the case of digital video signal data this collection of attributes has been found to provide a basic level of operability with different types of signal processing functions.

In many circumstances it is also desirable that the corresponding video header file specifies:

the colour matrix applied to said digital video signal data, and the gamma correction applied to said digital video signal data.

In order to provided a more comprehensive level of operability for a wider range of video data types, preferred embodiments of the invention have a header file specifying:

the filename for said digital video signal data, the creation date and time for said digital video signal data, the file type of said digital video signal data, the originating process that produced said digital video signal data, the project name related to said digital video signal data, explanatory text relating to said digital video signal data, the name of the originator of said digital video signal data, the signal type of said digital video signal data, whether said video data elements are signed video data elements, the position of any binary point within said video data elements, the relative position within a broadcast format field sequence of the first field of said digital video signal data, the original size of and position within each dimension of original digital video signal data from which said digital video signal data has been extracted, the timecode reference for said digital video data signal within a sequence of digital video signal data, whether and what type of data compression has been applied to said digital video signal data, and the aspect ratio for display of said digital video signal data.

In further preferred embodiments at least one of said one or more data files is composed of digital audio data comprising a plurality of audio data values with a corresponding header file specifying:

the number of channels of said digital audio data, the number of bytes storing each audio data value, the number of bits active in storing each audio data value within said audio data value storing bytes, the sampling rate in each channel of said digital audio data, and the number of audio data values in each channel of said digital audio data.

In the case of digital audio data this collection of attributes similarly provides a good basic level of operability.

In order to provided a more comprehensive level of operability for a wider range of audio data types, preferred embodiments of the invention have a header file specifying:

the filename for said digital audio data, the creation date and time for said digital audio data, the file type of said digital audio data, the originating process that produced said digital audio data, the project name related to said digital audio data, explanatory text relating to said digital audio data, the name of the originator of said digital audio data, the coding type of said digital audio data, the signal type of said digital audio data, the position of any binary point within said audio data values, and whether said digital audio data is sequentially sampled digital audio data.

It will be appreciated that it may be desirable that one or more data files represent a FIR filter. The filter may usually be used as a processing tool itself that is applied to other signal data (e.g. video data) whilst the filter data remains unaltered. Alternatively, signal processing functions may be carried to modify the filter itself, e.g. creation of an FIR filter using the Remez exchange algorithm.

Accordingly, in preferred embodiments at least one of said one or more data files is composed of digital finite impulse response filter coefficient data comprising a plurality of finite impulse response filter coefficient values with a corresponding header file specifying:

the number of dimensions of said digital finite impulse response filter coefficient data, the decimation factor in each dimension of said digital finite impulse response filter coefficient data, and the number of finite impulse response filter coefficient values in each dimension of said digital finite impulse response filter coefficient data.

As before, this collection of attributes has been found to provide a system able to perform a wide variety of signal processing functions and be capable of relatively straightforward extension.

In order to provided a more comprehensive level of operability for a wider range of FIR filter data types, preferred embodiments of the invention have a header file specifying:

the filename for said digital finite impulse response filter coefficient data, the creation date and time for said digital finite impulse response filter coefficient data, the file type of said digital finite impulse response filter coefficient data, the originating process that produced said digital finite impulse response filter coefficient data, the project name related to said digital finite impulse response filter coefficient data, explanatory text relating to said digital finite impulse response filter coefficient data, the name of the originator of said digital finite impulse response filter coefficient data, whether said digital finite impulse response filter coefficient data represents a separable filter, whether said digital finite impulse response filter coefficient data is integer digital finite impulse response filter coefficient data, and the sample rate specification in each dimension of said digital finite impulse response coefficient data.

In a manner similar to the FIR filters discussed above, in preferred embodiments of the invention at least one of said one or more data files models an infinite impulse response (IIR) filter with a transfer function of a first polynomial divided by a second polynomial, said data file containing polynomial coefficient value for said first and second polynomials with a corresponding header file specifying:

the order of said first polynomial, the order of said second polynomial, whether said transfer function is to be modelled as an analogue model or a discrete time model, and whether said transfer function is to be modelled directly or as parallel banks of cascaded biquadratic sections.

It will be appreciated by those skilled in the art that a infinite impulse response filter cane modelled as a transfer function comprising a first polynomial divided by a second polynomial. Furthermore, the transfer function can be modelled as being based upon an analogue system or a discrete time system. Similarly, the transfer function can be modelled directly or as it would operate when implemented as parallel banks of biquadratic sections.

In order to provided a more comprehensive level of operability for a wider range of IIR filter data types, preferred embodiments of the invention have a header file specifying:

the filename for said infinite impulse response filter polynomial coefficient data, the creation .date sand time for said infinite impulse response filter polynomial coefficient data, the file type of said infinite impulse response filter polynomial coefficient data, the originating process that produced said infinite impulse response filter polynomial coefficient data, the project name related to said infinite impulse response filter polynomial coefficient data, explanatory text relating to said infinite impulse response filter polynomial coefficient data, the name of the originator of said infinite impulse response filter polynomial coefficient data, the number of cascaded biquadratic sections in each parallel branch if said transfer function is so modelled, the number of parallel branches if said transfer function is so modelled, whether said polynomial coefficient values are integer polynomial coefficient values, and the sample rate specification of said infinite impulse response filter.

Another possible form of data the engineer may be interest in is frequency response data. Accordingly, in preferred embodiments at least one of said one or more data files is composed of digital frequency response data comprising a plurality of frequency response data values with a corresponding header file specifying:

the number of dimensions of said digital frequency response data, the sampling rate in each dimension of said digital frequency response data, and the number of frequency response data values in each dimension.

As before, this selection of attributes has been found to be particularly appropriate for frequency response data files.

In order to provided a more comprehensive level of operability for a wider range of frequency response data types, preferred embodiments of the invention have a header file specifying:

the filename for said digital frequency response data, the creation date and time for said digital frequency response data, the file type of said digital frequency response data, the originating process that produced said digital frequency response data, the project name related to said digital frequency response data, explanatory text relating to said digital frequency response data, the name of the originator of said digital frequency response data, the end points in each dimension of said digital frequency response data, the type of distribution in each dimension of said digital frequency response data.

It has been found particularly useful if in preferred embodiments of the invention each header data specifies previous manipulations that have been performed upon its corresponding data file. This allows the history of the data within a data file to be tracked which may well be important in analyzing the results of signal processing functions applied to that data.

Each signal processing function could be responsible for reading and writing its own data and header files. However, an advantageously efficient embodiment of the invention includes common data and header file reading and writing means that reads from and writes to said data and header files whichever signal processing function is selected.

In order to enhance the possibilities for extension to the system it has been found advantageous to provide that said header files include one or more blank fields to provide for further attributes not yet specified.

It has been found simple and efficient in preferred embodiments of the invention that each data file and corresponding header file form a composite file with said header file at the start of said composite file.

Viewed from another aspect the invention provides a method of designing, analyzing or simulating signal processing functions, said method comprising the steps of:

(i) storing one or more data files to be processed;

(ii) storing a header file corresponding to each of said one or more data files specifying a plurality of attributes of data within each of said one or more data files;

(iii) selecting one of said one or more data files to undergo a signal processing function;

(iv) selecting one of a plurality of signal processing functions to be carried out upon data within a data file; and (v) performing a selected signal processing function upon data within a selected data file in dependence upon a set of attributes read from a header file corresponding to said selected data file.

The above, and other objects features and advantages of this invention will be apparent from the following detailed description of illustrative embodiments which is to be read in connection with the accompanying drawings.

DESCRIPTION OF THE PREFERRED EMBODIMENTS

Figure 1:
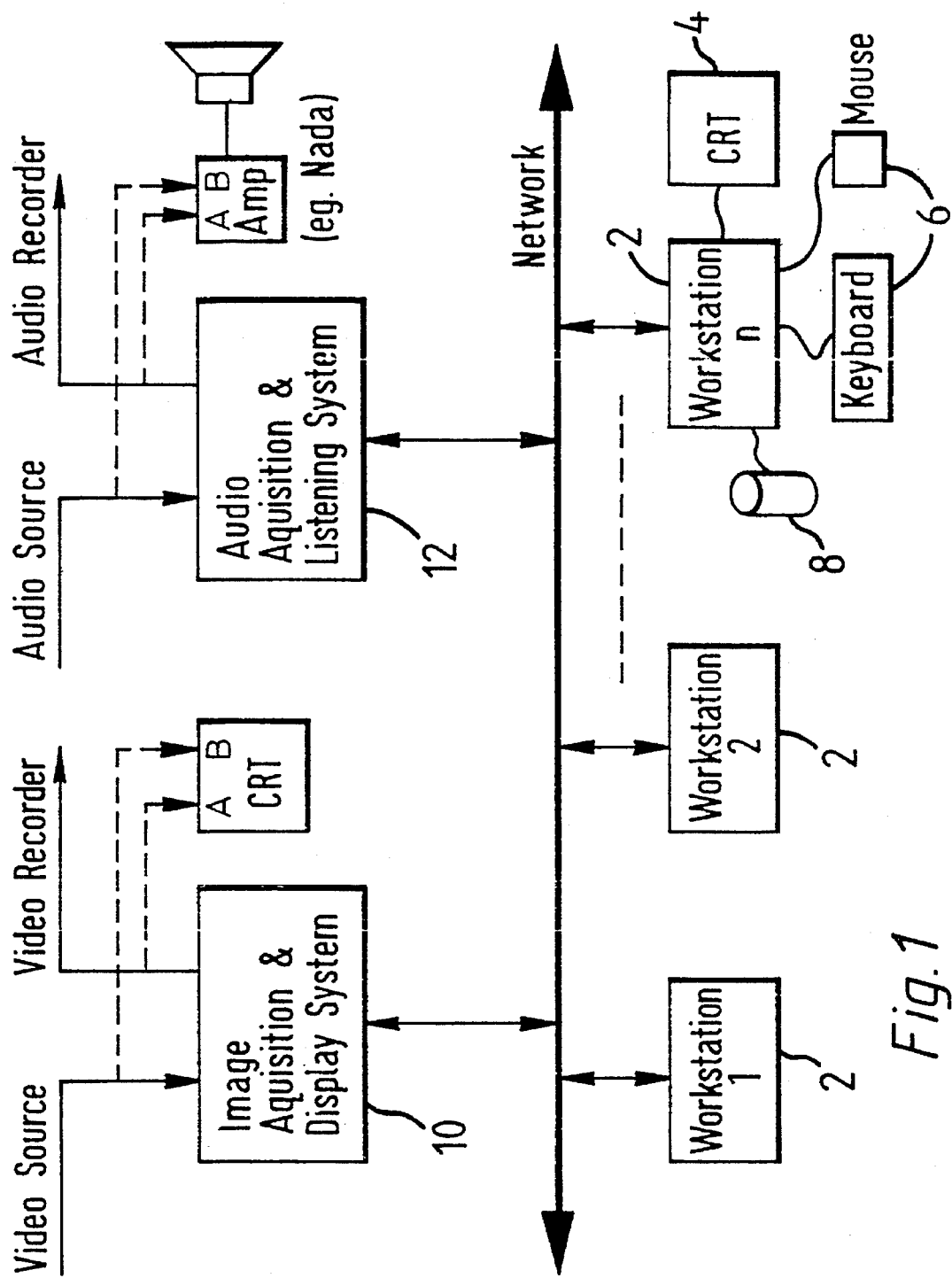
FIG. 1 illustrates a computer network system that can be used to embody the invention.

FIG. 1 shows a computer network comprised of a plurality of interlinked workstations 2. Each workstation 2 includes a cathode ray tube display (CRT) 4, user input/selection devices 6 (e.g. keyboard and mouse) and a data storage apparatus 8 (e.g magnetic disk). An image acquisition and display system 10 and an audio acquisition and listening system 12 are also connected to the network for the purpose of input and output of data from the system.

Figure 2:
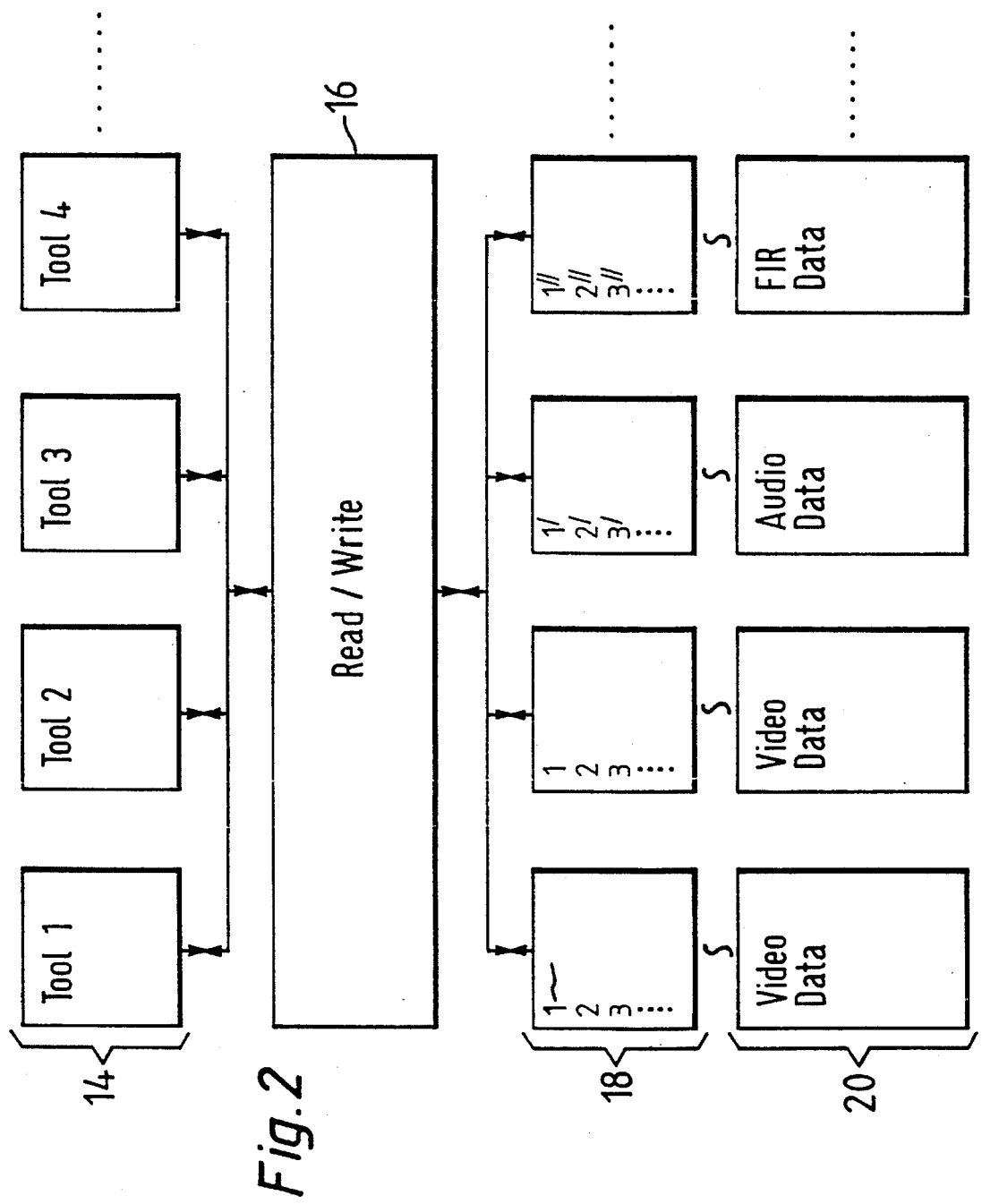
FIG. 2 illustrates the relationship between the tools, read/write utilities, header files and data files in this embodiment.

FIG. 2 illustrates the relationship of the plurality of signal processing function tools 14, read and write utilities 16, header files 18 and the data files 20. The header files 18 and the data files 20 are stored in the data storage apparatus 8 of the workstation 2. A common single set of read and write utilities 16 are shared between the various tools 14 to access the header files 18 and the data files 20. Each of the signal processing function tools 14 can be implemented as a computer program for manipulating accessed header files 18 and data files 20 using one of the workstations 2.

A system user at one of the workstations 2 will manipulate the user input/selection devices 6 to select one or more pairs of associated header files 18 and data files 20 for manipulation. The system user will also select one of the signal processing function tools 14 to manipulate the accessed header and data files 18, 20. The read and write utilities 16 then read the appropriate header files 18 and data files 20 from the data storage apparatus 8 into the workstation 2. The read data is then manipulated by the selected signal processing function tool 14. For the sake of simplicity, the read/write utilities 16 read the entire header file into a data structure that can be accessed by the signal processing function tool 14; the signal processing function tool 14 then only reads those attributes it actually needs from within this data structure. The results of the manipulation could be displayed using the CRT 4 and/or saved using the read/write utilities 16 into the appropriate header files 18 and data files 20.

Figure 3:
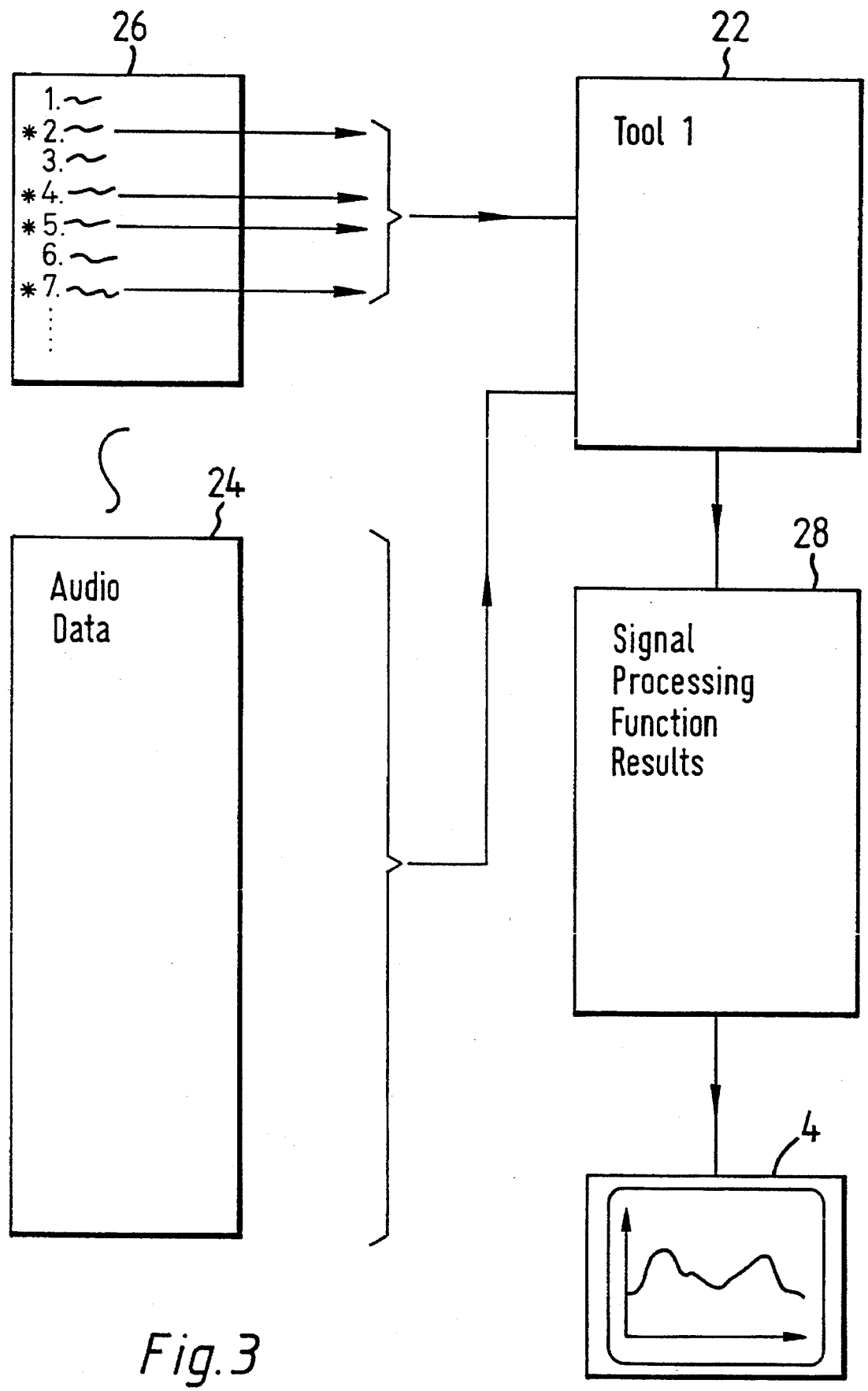
FIG. 3 schematically illustrates the operation of one tool upon one form of data.

FIG. 3 illustrates the operation of a selected tool 22 upon an audio data file 24 and its associated header file 26, which for simplicity are combined into a single composite file within the data storage apparatus 8, the header file forming the first part of each composite file. It will be understood that the header file 26 may or may not be stored directly adjacent to or combined with its associated audio data file 24. The selected tool 22 responds to those attributes from the header file 26 that are marked with a "*". This set of attributes are those required by the particular selected tool 22 from amongst the much broader range of attributes stored within the header file 26. Using the accessed attributes the selected tool 22 then processes the data within the audio data file 24 in the manner desired by the user to produce the signal processing function results 28.

In this case the selected tool 22 is a spectral analysis tool and the signal processing function results 28 represent the frequency characteristics of the data within the audio data file 24. The spectral characteristic thus obtained is displayed upon the workstation CRT 4.

Figure 4:
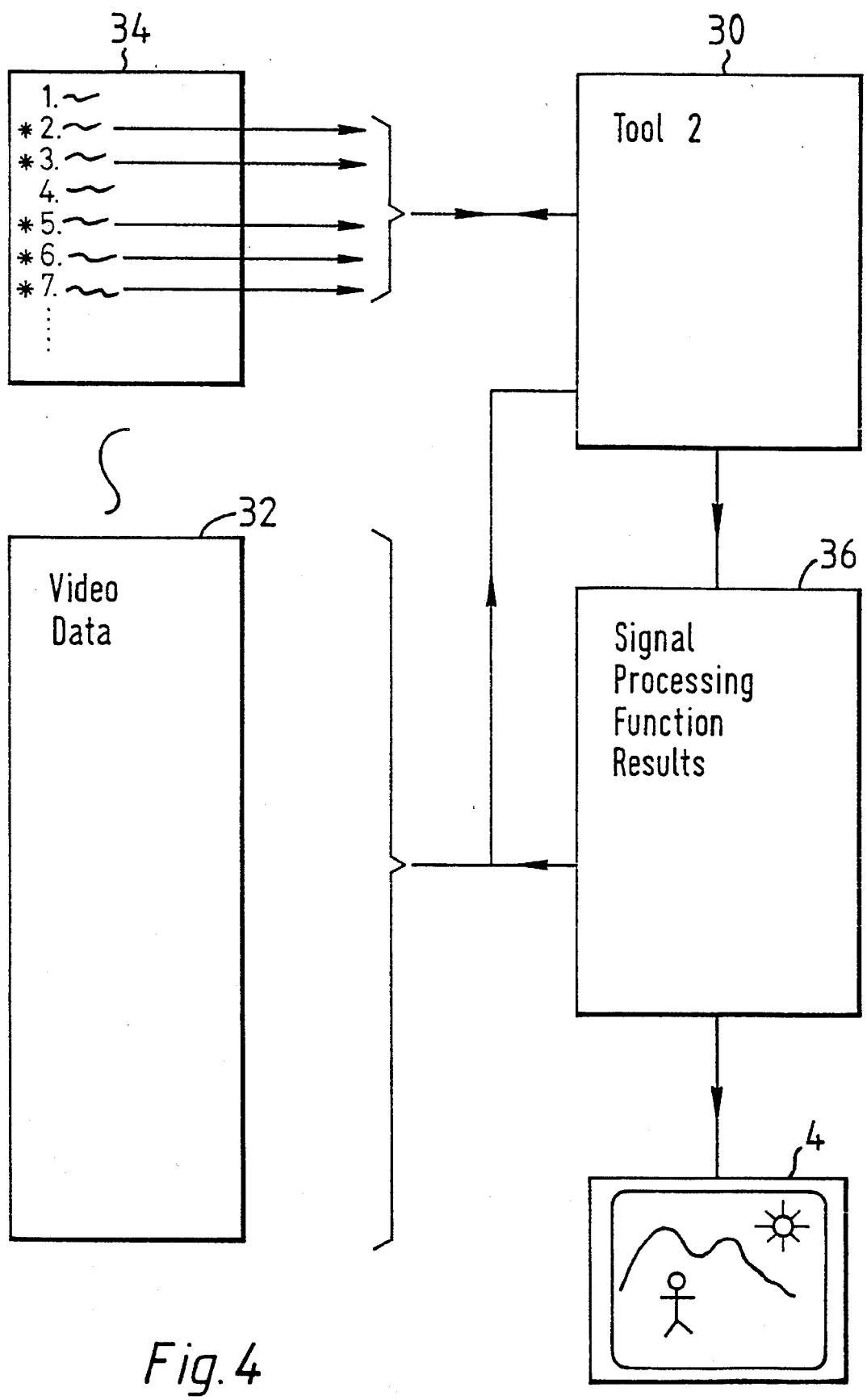
FIG. 4 schematically illustrates the operation of another tool of another form of data.

FIG. 4 illustrates another example of the operation of an embodiment of this invention. A selected tool 30 accesses a video data file 32 and its associated header file 34. Once more the selected tool 30 is responsive to particular ones of the attributes stored in the header file 34. Using these attributes the selected tool 30 carries out its signal processing function upon the data from within the video data file 32 to produce the signal processing function results 34.

In this case, the selected tool 30 is a 2-dimensional FIR filter and the signal processing function results are a filtered version of the video data from within the video data file 32. The filtered image is displayed upon the CRT 4. The filtered image is returned into the video data file 32 to form a filtered video data file 32. The attributes within the header file 34 are updated by the selected tool 30 to indicate that a particular filtering process has been carried out upon the data now stored within the associated video data file 32.

The finite impulse response filter that is used by the selected tool 30 could be a fixed FIR filter or could be a variable filter read from a FIR data file and header file pair within the system.

The details of an exemplary set of header file and data file types with their format and interrelationship are as follows:

AUDIO

GENERAL

1. This format covers the representation of PCM coded 2's complement binary audio data, for one or more channels.

2. Data in the file after the header is stored in binary format.

3. Files that conform to the following description should use the ".aud" file extension.

FILE HEADER

| | | |
|---|---|---|
| 0 | FILENAME: | string[57]\n |
| 1 | CREATION DATE: | string[57]\n |
| 2 | FILE TYPE: | Audio Data\n |
| 3 | ORIGINATING PROCESS: | string[57]\n |
| 4 | PROJECT NAME: | string[57]\n |
| 5 | TITLE: | string[57]\n |
| 6 | COMMENT1: | string[57]\n |
| 7 | COMMENT2: | string[57]\n |
| 8 | ORIGINATOR: | string[57]\n |
| 9 | CODING: | string[57]\n |
| 10 | DATA TYPE: | string[1]\n |
| 11 | CHANNELS: | unsigned integer\n |
| 12 | No BYTES PER SAMPLE: | unsigned integer\n |
| 13 | No ACTIVE BITS: | unsigned integer\n |
| 14 | SCALE FACTOR: | unsigned integer\n |
| 15 | SEQUENTIAL: | string[1]\n |
| 16 | SAMPLING RATE: | WX.XXXXXXXXXXXXXXXXYZXX\n |
| 17 | SIZE: | unsigned integer\n |
| 18 | \n | |
| 19 | \n | |
| 20 | \n | |
| 21 | \n | |
| 22 | \n | |
| 23 | \n | |
| 24 | \n | |
| 25 | \n | |
| 26 | \n | |
| 27 | \n | |
| 28 | \n | ;last line of header |

HEADER SYNTAX

1. The header is restricted to 80 columns to allow for easy readability on all display devices and printouts.

2. Items after and including ";" are comments and are not part of the file format.

3. Items after column 22 are specific to each audio file and occur after the definition for each line. These items can be followed by comments up to column 79.

4. Integers are in the range of 0 to 99999999999999999999999 in a field width of 23 right justified to column 44.

5. string[n]=an array of characters of length n where the ASCII code of each character lies between 0x20 and 0x7e. Strings will be left justified to column 22.

WX.XXXXXXXXXXXXXXXXYZXX are defined as follows:

W = one of the set [+, ,–]

X = one of the set [0,1,2,3,4,5,6,7,8,9]

Y = one of the set [E,e,D,d]

Z = one of the set [+,–]

7. \n = new line character [0x0a]this should be the only character within the file header which lies outside the range 0x20 to 0x7e.

8. The file header information occupies the first 29 lines of the file. The header data is terminated by the character [0xfe] which occurs after the newline character of the last header line. Data in the file will start on line 29.

FIELD DESCRIPTION

L0: FILENAME refers to the filename of the audio file without the ".aud" extension and does not include any path.

L1: CREATION DATE is specified as YYYY MM DD HH:MM:SS. Single spaces are used to separate the year, month, day and time fields. Colons are used to separate hours, minutes and seconds.

L2: FILE TYPE indicates that this file contains video data and is set to 'Audio Data'.

L3: ORIGINATING PROCESS is the name of the program which spawned the audio data. This can be useful for back-traceability.

L4: PROJECT NAME is hopefully self-explanatory.

L5-7: TITLE, COMMENT1 and COMMENT2 can be used in an unrestricted
way to record any useful information about the data.

L8: ORIGINATOR is the name of the person who created the audio data file.

L9: CODING indicates the coding used to convert the data and is set to 'LINEAR', 'NICAM 676', 'NICAM 728', 'A-LAW', etc. as may be required.

L10: DATA TYPE one of the set [M,L,R,S]. This indicates the type of audio data stored in the file:

M—Mono

L—Left

R—Right

S—Stereo

L11: CHANNELS gives the number of audio channels present in the file. There are inter-relations between the DATA TYPE and CHANNELS fields.

| DATA TYPE | CHANNELS | Format of Audio Data |
|---|---|---|
| Mono | =1 | A single audio channel |
| Mono | >1 | CHANNELS independent audio channels |
| Left | =1 | A single audio channel which was or will be the left channel of a stereo pair |
| Left | >1 | Not normally encountered |
| Right | =1 | A single audio channel which was or will be right channel of a stereo pair |
| Right | >1 | Not normally encountered |
| Stereo | Odd | Not normally encountered |
| Stereo | Even | CHANNELS audio channels which may be assumed to be CHANNELS/2 stereo pairs CH 0 = left channel of first pair CH 1 = right channel of first pair CH 2 = left channel of second pair CH 3 = right channel of second pair etc. |

L12: No BYTES PER SAMPLE indicates how many bytes are required to fully represent one video data sample e.g. 8 bit data requires 1 byte only but 10 bit data will require 2 bytes. If more than one byte per sample is required then the ordering is most significant byte first. The bits comprising the bytes are most significant bit first. Machine portability is ensured by accessing each sample as a sequence of 'unsigned char' reads.

L13: No ACTIVE BITS indicates how many bits of each sample contain valid video data e.g. 10 bit data must be represented by two bytes per sample but of these 16 bits only 10 will be active. The active data is stored in the most significant bits of the sample.

L14: SCALE FACTOR this is an integer which gives the number of bits to the right of the binary point. For example, if the audio data consists of 12 bits, of which 11 are after the binary point, (i.e. the data covers the range from −1 to approximately +1) then the scale factor will be 11.

L15: SEQUENTIAL one of the set [Y,N] to indicate whether or not the audio data in the file is from a sequential sample source. This field is normally only set to 'Y' if the DATA TYPE field is set to 'L', 'R' or "S" and signifies that the right channel samples were converted from the continuous to the sample domains one half sample period AFTER the corresponding left channel samples. Thus to convert a sequentially sampled file to the more normal SIMULTANEOUS mode, a one half sample delay is placed in the left channel. Conversely, to convert a simultaneously sampled file to a sequentially sampled file, a one half sample delay is placed in the right channel.

L16: SAMPLING RATE gives the sampling rate in Hertz. Thus, typical values might be:

| | |
|---|---|
| SAMPLING RATE | $3.2000000000000000E + 04$ |
| SAMPLING RATE | $4.4100000000000000E + 04$ |
| SAMPLING RATE | $4.8000000000000000E + 04.$ |

L17: SIZE gives the size in samples of each channel of the data.

AUDIO DATA FORMAT

1. Audio data in the file is always in binary format
2. Audio data starts on line 29. Lines 0 to 28 contain the header information. If a data sequence is represented by a set of values D[t][c] where:

t=the temporal sample position c=the channel number then the audio data is stored in file, after the header, in the following way:

```
for ( t = 0; t < SIZE; t++)
    for (c = 0; c < CHANNELS; c++)
        D[t][c];
```

3. The total number of bytes stored in a file should be No OF BYTES PER SAMPLE X CHANNELS X SIZE

FIR FILTER

GENERAL

1. This is a unified definition to represent separable and non-separable 1d, 2d and 3d FIR filter coefficients.
2. The FIR filter coefficients are stored in expanded form, i.e. symmetrical coefficients are duplicated.
3. Filter coefficients are specified as double precision numbers. The filter coefficients are represented as ascii strings.
4. This file format encompasses rounded (i.e. integer) coefficients; a header field indicates whether the double precision numbers should be cast to integer in the host program.
5. Files that conform to the FIR filter coefficient file format use the fir extension.

| FILE HEADER | | |
|---|---|---|
| 0 | FILE-NAME: | string[57]\n |
| 1 | CREATION DATE: | string[57]\n |
| 2 | FILE TYPE: | FIR coefficient\n |
| 3 | ORIGI- | string[57]\n |

| FILE HEADER | | |
|---|---|---|
| | NATING PROCESS: | |
| 4 | PROJECT NAME: | string[57]\n |
| 5 | TITLE: | string[57]\n |
| 6 | COMMENT1: | string[57]\n |
| 7 | COMMENT2: | string[57]\n |
| 8 | ORIGINATOR: | string[57]\n |
| 9 | DIMENSIONS: | unsigned integer\n |
| 10 | SEPARABLE: | string[1]\n |
| 11 | DATA REPRESENTATION: | string[3]\n |
| 12 | INTEGER: | string[1]\n |
| 13 | H SAMPLE RATE: | WX.XXXXXXXXXXXXXXXXYZXX\n |
| 14 | H ACTUAL LENGTH: | unsigned integer\n |
| 15 | H DECIMATION FACTOR: | WX.XXXXXXXXXXXXXXXXYZXX\n |
| 16 | V SAMPLE RATE: | WX.XXXXXXXXXXXXXXXXYZXX\n |
| 17 | V ACTUAL LENGTH: | unsigned integer\n |
| 18 | V DECIMATION FACTOR: | WX.XXXXXXXXXXXXXXXXYZXX\n |
| 19 | T SAMPLE RATE: | WX.XXXXXXXXXXXXXXXXYZXX\n |
| 20 | T ACTUAL LENGTH: | unsigned integer\n |
| 21 | T DECIMATION FACTOR: | WX.XXXXXXXXXXXXXXXXYZXX\n |
| 22 | \n | |
| 23 | \n | |
| 24 | \n | |
| 25 | \n | |
| 26 | \n | |
| 27 | \n | |
| 28 | \n | ;last line of file header |

HEADER SYNTAX

As for AUDIO files.

FIELD DESCRIPTION

L0: FILENAME refers to the filename of this filter coefficient file without the .fir extension and does not include any path.

Li: CREATION DATE is specified as YYYY MM DD HH:MM:SS. Single spaces are used to separate the year, month, day and time fields. Colons are used to separate hours, minutes and seconds.

L2: FILE TYPE indicates that this file contains FIR filter coefficients and is recognised by the .fir extension and by the string 'FIR coefficient' on this line.

L3: ORIGINATING PROCESS this fields is generally used to specify the method of design used to derive the filter coefficients (e.g. Remez, Window sampling).

L4: PROJECT NAME the name of the project.

L5,6,7: TITLE, COMMENT1 and COMMENT2 the title and comment fields can be used in a unrestricted way. The comments may be used to record filter design parameters (e.g. Remez parameters). Alternatively, the title can be global with the comment fields representing a hierarchy of local titles.

L8: ORIGINATOR the designer's name.

L9: DIMENSIONS the number of dimensions can be 1, 2 or 3.

L10: SEPARABLE this string is one character long of the set [Y, N]and specifies whether the filter is separable (i.e. a set of 1 dimensional filters) or non-separable. For dimensions =1 this field is set to N.

L11: DATA REPRESENTATION this field indicates how the data is stored in the file after the header. This may be set to indicate either ASC or binary storage.

L12: INTEGER this string is one character long of the set [Y, N]and specifies whether the coefficient data is of integer precision. This field can be used to cast the coefficients to integer representation.

L13,16,19: [H,V,T]SAMPLE RATE sample rate specification in hertz for the horizontal, vertical and temporal dimensions.

L14,17,20: [H,V,T]ACTUAL LENGTH the actual length refers to the number of coefficients in each dimension and corresponds to the number of data values that should be read for each dimension.

L15,18,21: [H,V,T]DECIMATION FACTOR if this value is an integer >1 then the file represents an FIR filter designed as an interpolator and this value gives the decimation factor to be applied to extract each interpolator set. If this value is real between 0 and 1 then the file represents an interpolator designed by sampling the sin(x)/x function and this value gives the interpolator position (or sampling offset). If this value =1, it indicates a normal FIR filter and not an interpolator.

L22-28: Reserved for future expansion.

DATA FORMAT

A general 3d filter can be represented as the set of data values F[h][v][t] with h=1 to k, v=1 to m and t=1 to n. The actual length fields in the file header correspond to k, m and n for the horizontal, vertical and temporal dimensions respectively. For a separable 3d filter this reduces to F1[h] F2[v]F3[t]. The format for the coefficient data is specified using some C programming language syntax.

```
Case 1:    3d non-separable filter
    for (t=1; t<=n; t++)
        for (v=1; v<=m; v++)
            for (h=1; h<=k; h++)
                F[h][v][t]
Case 2:    2d non-separable filter
    for (v=1; v<=m; v++)
        for (h=1; h<=k; h++)
            F[h][v]
Case 3:    3d separable filter
    for (h=1; h<=k; h++) F1[h]
    for (v=1; v<=m; v++) F2[v]
    for (t=1; t<=n; t++) F3[t]
Case 4:    2d separable filter
    for (h=1; h<=k; h++) F1[h]
    for (v=1; v<=m; v++) F2[v]
Case 5:    1d filter
    for (h=1; h<=k; h++) F1[h]
```

1. Coefficients may be specified in ascii format.

2. Each coefficient takes the form:

WX.XXXXXXXXXXXXXXXXXYZXX where
W=one of the set [+,,−]
X=one of the set [0,1,2,3,4,5,6,7,8,9]
Y=one of the set [E,e,D,d]
Z=one of the set [+,−]
\n=newline 3. Coefficient data starts on line 29.

FREQUENCY RESPONSE

GENERAL

1. This is a unified definition to encompass 1d, 2d and 3d frequency response structures.

2. Frequency response data is specified as double precision numbers and is stored in ASCII format.

3. Files that conform to the following description should use the ".frq" File extension.

| FILE HEADER | | |
|---|---|---|
| 0 | FILENAME: | string[57]\n |
| 1 | CREATION DATE: | string[57]\n |
| 2 | FILE TYPE: | Frequency Response\n |
| 3 | ORIGINATING PROCESS: | string[57]\n |
| 4 | PROJECT NAME: | string[57]\n |
| 5 | TITLE: | string[57]\n |
| 6 | COMMENT1: | string[57]\n |
| 7 | COMMENT2: | string[57]\n |
| 8 | ORIGINATOR: | string[57]\n |
| 9 | DIMENSIONS: | unsigned integer\n |
| 10 | SEPARABLE: | string[3]\n |
| 11 | H SAMPLING RATE: | WX,XXXXXXXXXXXXXXXXXYZXX\n |
| 12 | H FREQ UPPER LIMIT: | WX.XXXXXXXXXXXXXXXXXYZXX\n |
| 13 | H FREQ LOWER LIMIT: | WX.XXXXXXXXXXXXXXXXXYZXX\n |
| 14 | H No OF POINTS: | unsigned integer\n |
| 15 | H DISTRIBUTION: | string[57]\n |
| 16 | V SAMPLING RATE: | WX.XXXXXXXXXXXXXXXXXYZXX\n |
| 17 | V FREQ UPPER LIMIT: | WX.XXXXXXXXXXXXXXXXXYZXX\n |
| 18 | V FREQ LOWER LIMIT: | WX.XXXXXXXXXXXXXXXXXYZXX\n |
| 19 | V No OF POINTS: | unsigned integer\n |
| 20 | V DISTRIBUTION: | string[57]\n |
| 21 | T SAMPLING RATE: | WX.XXXXXXXXXXXXXXXXXYZXX\n |
| 22 | F FREQ UPPER LIMIT: | WX.XXXXXXXXXXXXXXXXXYZXX\n |
| 23 | T FREQ LOWER LIMIT: | WX.XXXXXXXXXXXXXXXXXYZXX\n |
| 24 | T No OF POINTS: | unsigned integer\n |
| 25 | T DISTRIBUTION: | string[57]\n |
| 26 | \n | |
| 27 | \n | |
| 28 | \n | ;last line of file header |

HEADER SYNTAX
As for AUDIO files.

FIELD DESCRIPTION

L0: FILENAME refers to the filename of the data file without the ".frq" extension and does not include any path.

L1: CREATION DATE is specified as YYYY MM DD HH:MM:SS. Single spaces are used to separate the year, month, day and time fields. Colons are used to separate hours, minutes and seconds.

L2: FILE TYPE indicates that this file contains frequency response data and is set to 'Frequency Response'.

L3: ORIGINATING PROCESS is the name of the program which spawned the data. This can be useful for back-traceability.

L5–7: TITLE, COMMENT1 and CADMMENT2 can be used in an unrestricted way to record any useful information about the data.

L8: ORIGINATOR is the name of the person who created the data file.

L9: DIMENSIONS should be one of the set [1,2,3]; anything else is yet meaningless.

L10: DATA REPRESENTATION this indicates how the data is stored in the file after the header. This could be set to represent ASC or binary representations.

L11,16,21: [H,V,T]SAMPLING RATE gives the sampling rate in Hertz in the horizontal, vertical and temporal dimensions of the data.

L12,17,22: [H,V,T]NO OF POINTS gives the number of frequency response points that have been calculated in the horizontal, vertical and temporal directions.

L13,18,23: [H,V,T]FREQ UPPER LIMIT gives the value of the upper frequency limit of the response data in the three dimensions.

L14,19,24: [H,V,T]FREQ LOWER LIMIT gives the value of the lower frequency limit of the response data in the three dimensions.

L15,20,25: [H,V,T]DISTRIBUTION one of the set [LOG, LIN] to describe the type of distribution in use.

L24–28: Reserved for future expansion.

DATA FORMAT

1. Data starts on line 29. Lines 0 to 28 contain the header information.

2. Each frequency response point is stored as a set of four double precision numbers representing frequency (in Hz), gain (absolute), phase (in radians) and group delay (in seconds). Frequency response points will therefore appear in the file (if stored as ASCII) as is:

FREQUENCY AMPLITUDE PHASE GROUP_DELAY\n
FREQUENCY AMPLITUDE PHASE GROUP_DELAY544 n

Where [FREQUENCY,AMPLITUDE,PHASE,GROUP_DELAY] are all of the form:

WX.XXXXXXXXXXXXYZXZ
  W=one of the set [+, ,−]
  X=one of the set [0,1,2,3,4,5,6,7,8,9]
  Y=one of the set [E,e,D,d]
  Z=one of the set [+,−]

The mantissa is of reduced resolution so that the lines containing the four floating point numbers will not occupy positions beyond column 79.

If a frequency response is represented by a set of values $F[h][v][t]$ where h, v and t are the horizontal, vertical and temporal frequencies respectively, and $F[h][v][t]$ contains four double precision numbers one each to represent frequency, amplitude, phase and group delay then frequency response points are stored in the file, after the header, in the following way:

for (t=0;t<T No OF POINTS;t++)
  for (v=0;<V No OF POINTS;v++)
  for (h=0;h<No OF POINTS;h++)
  F[h][v][y];

3. The total number of lines stored in a file in this way should be

H No OF POINTS×V No OF POINTS×T No OF POINTS

INFINITE IMPULSE RESPONSE (IIR) FILTER

GENERAL

1. This is a unified definition to represent 1 dimensional analogrue and digital IIR filters.

2. Two realisations are supported:
  Direct Form Transfer functions represented as a rational function of s (analogue) or z (digital) of arbitrary order.
  Interconnection of Biquadratic Sections Transfer functions represented as a parallel bank of cascaded sections. In most cases the filter will be implemented as either a cascade or a parallel bank of biquadratic sections.

3. Filter values are specified as double precision numbers. The filter values are represented as ASCII strings.

4. This file format encompasses rounded (i.e. integer) coefficients for digital filter implementation; a header field indicates whether the double precision numbers should be cast to integer numbers in the host program.

5. Files that conform to the IIR filter file format use the .iir extension.

6. Only 1 dimensional filter structures are supported; multiple dimension filters are normally only applicable to video signals, where the non-linear phase response of IIR filters makes them unsuitable.

FILE HEADER

| | | |
|---|---|---|
| 0 | FILENAME: | string[57]\n |
| 1 | CREATION DATE: | string[57]\n |
| 2 | FILE TYPE: | IIR Filter\n |

-continued

FILE HEADER

| | | |
|---|---|---|
| 3 | ORIGINATING PROCESS: | string[57]\n |
| 4 | PROJECT NAME: | string[57]\n |
| 5 | TITLE: | string[57]\n |
| 6 | COMMENT1: | string[57]\n |
| 7 | COMMENT2: | string[57]\n |
| 8 | ORIGINATOR: | string[57]\n |
| 9 | NUMERATOR ORDER: | unsigned integer\n |
| 10 | DENOMINATOR ORDER: | unsigned integer\n |
| 11 | REALISATION: | string[57]\n |
| 12 | CASCADED SECTIONS: | unsigned integer\n |
| 13 | PARALLEL BRANCHES: | unsigned integer\n |
| 14 | DATA REPRESENTATION: | string[3]\n |
| 15 | INTEGER: | string[1]\n |
| 16 | PLANE: | string[1]\n |
| 17 | SAMPLE RATE: | WX.XXXXXXXXXXXXXXXXYZXZ\n |
| 18 | \n | |
| 19 | \n | |
| 20 | \n | |
| 21 | \n | |
| 22 | \n | |
| 23 | \n | |
| 24 | \n | |
| 25 | \n | |
| 26 | \n | |
| 27 | \n | |
| 28 | \n | ;last line of file header |

HEADER SYNTAX
  As for AUDIO files.

FIELD DESCRIPTION
  L0: FILENAME refers to the filename of this filter coefficient file without the .iir extension and does not include any path.
  L1: CREATION DATE is specified as YYYY MM DD HH:MM:SS. Single spaces are used to separate the year, month, day and time fields. Colons are used to separate hours, minutes and seconds.
  L2: FILE TYPE An IIR filter file is recognised by the ".iir" extension and the string "IIR Filter" on this line.
  L3: ORIGINATING PROCESS This field is generally used to specify the method of design used to derive the filter values.
  L4: PROJECT NAME The name of the project.
  L5, 6,7: TITLE, COMMENT1 and COMMENT2 The title and comment fields can be used in an unrestricted way. The comments may be used to record filter design parameters (eg the prototype analogue filter used to design digital IIR filter). Alternatively, the title can be global with the comment fields representing a hierarchy of local titles.
  L8: ORIGINATOR The designer's name.

L9: NUMERATOR ORDER is the order of the filter's transfer function (ie the highest power of s or z). This field should be set to "2" if the Realisation field is set to "BIQUAD".

L10: DENOMINATOR ORDER is the order of the filter's transfer function (ie the highest power of s or z). This field should be set to "2" if the Realisation field is set to "BIQUAD".

L11: REALISATION One of the set [DIRECT, BIQUAD]. The file format is capable of handling multiple order direct form or parallel cascaded biquadratic section realisations. The direct form is useful for prototyping using floating point number representation for the filter values. The parallel cascaded biquadratic section approach is the usual way of hardware implementation and therefore is necessary to investigate finite wordlength effects on digital filter performance.

L12: CASCADED SECTIONS The number of cascaded biquadratic sections per parallel branch, including any first order sections (see L13). It is assumed that the number of cascaded sections is the same for all parallel branches. This field should be set to "1" if the Realisation field is set to "DIRECT".

L13: PARALLEL BRANCHES The number of parallel branches of cascaded sections. This field should be set to "1" if the Realisation field is set to "DIRECT".

L14: DATA REPRESENTATION This field indicates how the filter data is stored in the file after the header. This could be set to indicate ASC or binary representations.

L15: INTEGER One of the set [Y, N], indicating whether or not the filter values may be cast directly as INTEGERS in the application program. This would be used when investigating finite wordlength effects in digital filters. In such cases, the stored coefficients would not necessarily be normalised to unity.

L16: PLANE One of the set [S, Z], indicating in which plane the filter values are specified. Normally, "S" implies an analogue filter and "Z" implies a digital filter.

L17: SAMPLE RATE The sample rate at which the digital IIR filter was designed. For analogue filter data, this field should be set to 0.

DATA FORMAT

A general IIR filter may be represented in two ways as described earlier. The data format for each is specified below using some C-code structures.

```
REALISATION = DIRECT
    PARALLEL BRANCHES = 1
    CASCADED SECTIONS = 1
    NUMERATOR ORDER = m
    DENOMINATOR ORDER = n
    for (i=0;i<=m;i++)
        fscanf(iir_fp,"%lf",&numerator_filter_value);
        /*a0 to am */
    for (i=0;i<=n;i++)
        fscanf(iir_fp,"%lf",&denominator_filter_value);
        /*b0 to bn */
``` where fscanf is a read command, iir_fp is a file identifier for the file to be read, %lf specifies the data is long floating point data and &numerator_filter_value/&denominator_filter_13 value are the identifiers for the data structure into which the read data is to be transferred.

```
REALISATION = BIQUAD
    PARALLEL BRANCHES = p
    CASCADED SECTIONS = c
    NUMERATOR ORDER = 2
    DENOMINATOR ORDER = 2
    for (i=0;i<p;i++)
        for (j=0;j<c;j++)
        {
        for (k=0;k<=2;k++)
            fscanf(iir_fp,"%lf",&numerator_filter_value);
            /* a0 to a2 */
        for (k=0;k<=2;k++)
            fscanf(iir_fp, "%lf",&denominator_filter_value)
            /* b0 to b2 */
        }
```

1. Filter,values are specified in ASCII format.
2. Each value takes the form:
WX. XXXXXXXXXXXXXXXXYZXZ where
   W=one of the set [+, , −]
   X=one of the set [0,1,2,3,4,5,6,7,8,9]
   Y=one of the set [E,e,D,d]
   Z=one of the set [+, −]
3. Filter data starts on line 29.

VIDEO

GENERAL

1. This is a unified definition to encompass 2d and 3d data structures enabling video sequences to be represented in a standard way.
2. Data in the file after the header is stored in binary format.
3. Files that conform to the following description should use the ".vid" file extension.
4. Multiple components representing the same video sequence are stored in separate files. The following file naming restrictions are imposed for the standard components:

| | | | |
|---|---|---|---|
| R (red): | name_R.vid | or | name_r.vid |
| G (green): | name_G.vid | or | name_g.vid |
| B (blue): | name_B.vid | or | name_b.vid |
| Y (luminance): | name_Y.vid | or | name_y.vid |
| C (chrominance): | name_C.vid | or | name_c.vid |

FILE HEADER

| | | |
|---|---|---|
| 0 | FILENAME: | string[57]\n |
| 1 | CREATION DATE: | string[57]\n |
| 2 | FILE TYPE: | Video Data\n |
| 3 | ORIGINATING PROCESS: | string[57]\n |
| 4 | PROJECT NAME: | string[57]\n |
| 5 | TITLE: | string[57]\n |
| 6 | COMMENT1: | string[57]\n |
| 7 | COMMENT2: | string[57]\n |
| 8 | ORIGINATOR: | string[1]\n |
| 9 | DIMENSIONS: | unsigned integer\n |
| 10 | DATA TYPE: | string[1]\N |
| 11 | SIGNED: | string[1]\n |

-continued

| FILE HEADER | | |
|---|---|---|
| 12 | No BYTES PER SAMPLE: | unsigned integer\n |
| 13 | No ACTIVE BITS: | unsigned integer\n |
| 14 | SCALE FACTOR: | string[1]\n |
| 15 | INTERLACED: | string[1]\n |
| 16 | FIRST FIELD No: | string[1]\n |
| 17 | H SAMPLING RATE: | WX.XXXXXXXXXXXXXXXXYZXZ\n |
| 18 | H ORIGINAL SIZE: | unsigned integer\n |
| 19 | H EXTRACT START: | unsigned integer\n |
| 20 | H EXTRACT START: | unsigned integer\n |
| 21 | V SAMPLING RATE: | WX.XXXXXXXXXXXXXXXXYZXZ\n |
| 22 | V ORIGINAL SIZE: | unsigned integer\n |
| 23 | V EXTRACT START: | unsigned integer\n |
| 24 | V EXTRACT START: | xnsigned integer\n |
| 25 | T SAMPLING RATE: | WX.XXXXXXXXXXXXXXXXYZXZ\n |
| 26 | T ORIGINAL SIZE: | unsigned integer\n |
| 27 | T EXTRACT START: | unsigned integer\n |
| 28 | T EXTRACT START: | unsigned integer\n |
| 29 | TIMECODE REFERENCE: | string[11]\n |
| 30 | COMPRESSION: | string[4]\n |
| 31 | COLOUR MATRIX: | unsigned integer\n |
| 32 | GAMMA: | unsigned integer\n |
| 33 | ASPECT RATIO: | WX.XXXXXXXXXXXXXXXXYZXZ\n |

HEADER SYNTAX
As for AUDIO files.
FIELD DESCRIPTION
L0: FILENAME refers to the filename of the video file without the ".vid" extension and does not include any path.
L1: CREATION DATE is specified as YYYY MM DD HH:MM:SS. Single spaces are used to separate the year, month, day and time fields. Colons are used to separate hours, minutes and seconds.
L2: FILE TYPE indicates that this file contains video data and is set to 'Video Data'.

L3: ORIGINATING PROCESS is the name of the program which spawned the video data. This can be useful for back-traceability.
L4: PROJECT NAME is hopefully self-explanatory.
L5–7: TITLE, COMMENT1 and COMMENT2 can be used in an unrestricted way to record any useful information about the data.
L8: ORIGINATOR is the name of the person who created the video data file.
L9: DIMENSIONS should be one of the set [1,2,3] anything else is as yet meaningless.
L10: VIDEO DATA TYPE one of the set [Y,C,R,G,B,P,N]. Indicating the type of video data stored in the file Y - Luminance Component C - Chrominance Component (2 sub-sampled multiplexed colour difference components)

R - Red Component

G - Green Component

B - Blue Component

P - Composite PAL

N - Composite NTSC

L11: SIGNED one of the set [Y,N]indicating whether the video data is stored in signed format (Y) or unsigned format (N). If signed ='Y' then 2's compliment notation is used.
L12: No BYTES PER SAMPLE indicates how many bytes are required to fully represent one video data sample, e.g. 8 bit data requires 1 byte only but 10 bit data will require 2 bytes. If more than one byte per sample is required, then the ordering is most significant byte first. The bits comprising the bytes are most significant bit first. Machine portability is ensured by accessing each sample as a sequence of 'unsigned char' reads.
L13: No ACTIVE BITS indicates how many bits of each sample contain valid video data, e.g. 10 bit data is represented by two bytes per sample but of these 16 bits only 10 will be active. The active data is stored in the most significant bits of the sample.
L14: SCALE FACTOR This is an integer which gives the number of bits to the right of the binary point. For example if the video data consists of 12 bits of which four are after the binary point (i.e. the data has a resolution of $\frac{1}{16}$ or 0.0625) then the scale factor will be 4.
L15: INTERLACED one of the set [Y,N]to indicate whether the video data in the file is from a 2:1 interlace source, i.e. that re-interlacing of two fields is required to give a correct display.
L16: FIRST FIELD No one of the set [0,1,2,3,4,5,6,7]to indicate the position of the first field of video data within an eight field sequence. [For composite NTSC only the set [0,1,2,3]will be valid.) [For Components only the set [0,1] will be valid.)
L17,12,25: [H,V,T]SAMPLING RATE gives the sampling rate in Hertz in the horizontal, vertical and temporal dimensions of the video data, eg a 625 line 50 Hz 2:1 interlace source sampled according to CCIR recommendation 601 would have

| H SAMPLING RATE | 1.3500000000000000E + 07 |
| V SAMPLING RATE | 1.5625000000000000E + 04 |
| T SAMPLING RATE | 5.0000000000000000E + 01 |

L18,22,26: [H,V,T]ORIGINAL SIZE gives the size (in samples) of the original source before any extraction is performed.
L19,23,27: [H,V,T]EXTRACT START gives the offset (in samples) from the origin of the original sequence at which the extracted region starts.

L20,24,28: [H,V,T]EXTRACT SIZE gives the size of the extracted region (in samples).

L29: TIMECODE REFERENCE gives the timecode equivalent of T EXTRACT START to allow video files to be reassembled according to their source sequence positions. TIMECODE REFERENCE is specified as HH:MM:SS:FF where H represents hours, M represents minutes, S represents seconds and F represents frames. All 11 characters must be present.

L30: COMPRESSION Only lossless compression is supported. The string can taken on the values: NONE—no compression JPEG—lossless baseline JPEG compression LZA—Lempel-Ziv-Walsh compression L31: COLOUR MATRIX Standard colorimetry can be specified or a customized colour transformation matrix can be defined.

1: CCIR Rec.601 colour transformation matrix

2: SMPTE 240M colour transformation matrix

3–8: other standard colour transformation matrices

9: The colour matrix values are defined in a separate file (in the same directory) of the same name without the _? characters and with the extension .mtx. This file consists of 18 real numbers on 18 separate lines. The data order is determined by scanning each row of the forward matrix followed by each row of the inverse matrix.

L32: GAMMA can be specified mathematically as a power function (y=power(x,1/g)) or an arbitrary gamma can be defined using a lookup table for each pixel value.

1: no gamma

2: g=2.2

3–8: other standard gamma values

9: The gamma curve is defined in a separate file (in the same directory) of the same name but with the extension .gam. This file consists of n real numbers on n separate lines. The value of n is determined by the number of active bits (n=256 for 8 active bits).

L33: ASPECT RATIO is expressed as a real number by dividing the display device horizontal dimension by the display device vertical dimension. This field together with the H original size and V original size can be used to compute the pixel shape.

VIDEO DATA FORMAT

1. Video data in the file is in binary format.

2. Video data starts on line 34. Lines 0 to 33 contain the header information.

3. If a data sequence is represented by a set of values D[h][v][t] where h, v and t are the horizontal, vertical and temporal sample positions respectively, then video data is stored in the file, after the header, in the following way

```
for (t=0;t<T EXTRACT SIZE;t++)
    for (v=0;v<V EXTRACT SIZE;v++)
        for (H=0;h<H EXTRACT SIZE;h++)
            D[h][v][t];
```

4. The total number of bytes stored in a file should be

No OF BYTES PER SAMPLE×

H EXTRACT SIZE× V EXTRACT SIZE× T EXTRACT SIZE

EXAMPLE SIGNAL PROCESSING FUNCTION TOOL

As a more detailed example of a signal processing function tool and its requirements for attribute data from above detailed VIDEO header file, an image display tool XDISP will now be described. The attributes from the VIDEO header files described above that are required are indicated between parenthesis at the end of each paragraph. The most relevant points about this tool are as follows:

1. XDISP needs to know how many bytes are used to represent each pixel. A byte is the fundamental storage unit so that each pixel is represented by an integer multiple of bytes. XDISP also needs to know how many of the bits within the bytes ape active. For example, some video standards define 10 bits of pixel resolution so that 2 bytes per pixel ape required and the lower 10 bits of the 16 bits ape active. Also XDISP needs to know whether the active bits ape signed or unsigned and whether the values have been scaled or not.

(No BYTES PER SAMPLE, No ACTIVE BITS, SIGNED, SCALE FACTOR)

2. XDISP needs to know how many pixels are contained on each line and also how many lines make up the image.

(H ORIGINAL SIZE, V ORIGINAL SIZE)

3. The amount of data comprising an image is large so that it is possible to store this data in a lossless compressed format. If the compression option is set then XDISP must first uncompress the data using the appropriate algorithm before displaying.

( COMPRESSION )

4. XDISP has the ability to display a single component of an image (Y, C, R, G, B etc) or it can display an image in colour by installing the appropriate display look-up table. If a colour display is required then XDISP must retrieve all the components for the image. Since, the display look-up table can only store 256 colours, an optimisation routine is used to select 256 colours which will best match the image. This routine works in the R, G, B space so that images specified as Y, U, V must first be converted using the appropriate colour matrix.

(DATA TYPE, COLOUR MATRIX <also file naming convention. I,–g,– b>).

5. XDISP could be modified to display a portion of an image. For example, a video file could represent the top left quarter of an image. To display this portion in the correct position, the following fields are used (assuming a 601 image).

(H EXTRACT START =0, V EXTRACT =0,

H EXTRACT SIZE =360, V EXTRACT SIZE =288).

6. For XDISP the following fields are fixed (T ORIGINAL SIZE (1), DIMENSION (2))

7. For XDISP the following fields are irrelevant or have no meaning:

( T EXTRACT START, T EXTRACT SIZE, FIRST FIELD NO,

INTERLACED, ASPECT RATIO, TIMECODE REFERENCE,

H SAMPLING RATE, V SAMPLING RATE, T SAMPLING RATE}

8. XDISP currently does not consult the GAMMA field and displays the data directly. However, if the data has been preprocessed using a gamma incompatible with the XDISP display device, then the data has to be undistorted first and then corrected using the compatible gamma. (GAMMA).

Examples of further types of signal processing function tool that may be used with the system of this inventions are:

DESIGN

Window—Design a 1—D FIR filter

Remez—Design a 1—D FIR filter

S-Filter—Design analogue filter in S-plane
Window 2—D—Design a 2—D FIR filter
ANALYSIS
Plot—Plots filter responses graphically
Plot 2—D—Plots 2—D filter responses graphically
Histogram—Produces histogram of data values
Spectra—Produces spectral analysis by fast Fourier transform (FFT)
Spectra 2-D—Produces 2-D spectral analysis by FFT
SIMULATION
Filter 1—D—Filters audio data
Filter 2—D—Filters video files
DCT—Transforms input into DCT coefficients
UTILITIES
Acquire audio—Record audio in audio file
Display—Show 2—D images on workstation
Audio display—Listen to audio on workstation
Acquire 2/3—D—Record images in video file
Animate 2/3—DShow moving image sequences These various example tools may be implemented using a computer program controlling a general purpose computer. The way to produce the above and other similar tools will be apparent to those skilled in the art.

READ/WRITE UTILITIES

Further details of the common read/write utilities of the above described system are as follows:

Each of the file formats (video, audio, fir, iir, frequency response) have five utility programs associated with them. In the description below xxx refers to rid, and fir, iir or frq.

1. Read$_{13}$ XXX

This utility accesses a data files and transfers the header information into a predefined structure. The associated data is then stored in a linear block of memory which is reserved using another utility called allocate $_{13}$ XXX.

2. Write $_{13}$ XXX

This utility transfers the information contained in the header structure to an output data file. The associated data is then transferred from memory to the data file.

3. Allocate$_{13}$ XXX

This utility reserves a specified amount of memory to store the data associated with a data file. This technique allows for efficient memory usage for all data sizes.

4. Get$_{13}$ XXX

This utility extracts a specified data value from the linear block of memory containing the data set.

5. Put—XXX

This utility loads a specified data value into a linear block of memory reserved for the data set.

It will be appreciated that the described embodiment of this invention is an implementation using computer software controlling a general purpose computer. Various computer program languages such as C, Fortran, Cobol and the like could be used. It will also be appreciated that having described the structure and interrelationship of the computer program together with the nature and format for the data to be stored in the various types of header and data file, many different computer programs could be produced that would implement the invention.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Apparatus for designing, analyzing or simulating signal processing operations, said apparatus comprising:

application data file storage means for storing at least one application data file containing application data available to be processed;

header file storage means for storing at least one header file, each corresponding to a respective one of said application data files and each containing a plurality of attributes associated with said application data of said corresponding application data file;

application data file selection means for selecting at least one of said application data files to be read in its entirety for a signal processing operation;

signal processing operation selection means for selecting one of a plurality of different signal processing operations to be performed using the application data read in its entirety from said selected application data file; and signal processing means for performing said selected signal processing operation using the application data read in its entirety from said selected application data file and for selecting a set of attributes from the plurality of attributes read in its entirety from the header file corresponding to said selected application data file, said selected set of attributes being only those necessary to perform said selected signal processing operation, said selected set of attributes being smaller than said plurality of attributes.

2. Apparatus as claimed in claim 1, wherein at least one of said application data files includes digital video signal data comprising a plurality of video data elements and wherein said corresponding header file comprises:

the spatial and temporal dimensions of said digital video signal data, the number of bytes storing each video data element, the number of bits active in storing each video data element within said video data element storing bytes, data indicating whether said digital video signal data is interlaced digital video signal data, the sampling rate in each dimension of said digital video signal data, and the number of video data elements in each dimension.

3. Apparatus as claimed in claim 2, wherein said corresponding header file further comprises:

the color matrix applied to said digital video signal data, and the gamma correction applied to said digital video signal data.

4. Apparatus as claimed in claim 2, wherein said corresponding header file further comprises:

the filename for said digital video signal data, the creation data and time for said digital video signal data, the file type of said digital video signal data, the originating process that produced said digital video signal data, the project name related to said digital video signal data, explanatory text relating to said digital video signal data, the name of the originator of said digital video signal data, the signal type of said digital video signal data, data indicating whether said video data elements are signed video data elements, the position of any binary point within said video data elements, the relative position within a broadcast format field sequence of the first field of said digital video signal data, the original size of and position within each dimension of original digital video signal data from which said digital video signal data has been extracted, the timecode reference for said digital video data signal within a sequence of digital video signal data, data indicating whether data compression has been applied and the type of data compression applied to said digital video signal data, and the aspect ratio for display of said digital video signal data.

5. Apparatus as claimed in claim 1, wherein at least one of said application data files includes digital audio data comprising a plurality of audio data values and wherein said corresponding header file comprises:

the number of channels of said digital audio data, the number of bytes storing each audio data value, the number of bits active in storing each audio data value within said audio data value storing bytes, the sampling rate in each channel of said digital audio data, and the number of audio data values in each channel of said digital audio data.

6. Apparatus as claimed in claim 5, wherein said corresponding header file further comprises:

the filename for said digital audio data, the creation date and time for said digital audio data, the file type of said digital audio data, the originating process that produced said digital audio data, the project name related to said digital audio data, explanatory text relating to said digital audio data, the name of the originator of said digital audio data, the coding type of said digital audio data, the signal type of said digital audio data, the position of any binary point within said audio data values, and data indicating whether said digital audio data is sequentially sampled digital audio data.

7. Apparatus as claimed in claim 1, wherein at least one of said application data files includes digital finite impulse response filter coefficient data comprising a plurality of finite impulse response filter coefficient values and wherein said corresponding header file comprises:

the number of dimensions of said digital finite impulse response filter coefficient data, the decimation factor in each dimension of said digital finite impulse response filter coefficient data, and the number of finite impulse response filter coefficient values in each dimension of said digital finite impulse response filter coefficient data.

8. Apparatus as claimed in claim 7, wherein said corresponding header file further comprises:

the filename for said digital finite impulse response filter coefficient data, the creation date and time for said digital finite impulse response filter coefficient data, the file type of said digital finite impulse response filter coefficient data, the originating process that produced said digital finite impulse response filter coefficient data, the project name related to said digital finite impulse response filter coefficient data, explanatory text relating to said digital finite impulse response filter coefficient data, the name of the originator of said digital finite impulse response filter coefficient data, data indicating whether said digital finite impulse response filter coefficient data represents a separable filter, data indicating whether said digital finite impulse response filter coefficient data are integers and the sample rate specification in each dimension of said digital finite impulse response coefficient data.

9. Apparatus as claimed in claim 1, wherein at least one of said application data files represents an infinite impulse response filter with a transfer function of a first polynomial divided by a second polynomial, said data file being comprised of infinite impulse response filter polynomial coefficient data values for said first and second polynomials and wherein said corresponding header file comprises:

the order of said first polynomial, the order of said second polynomial, data indicating whether said transfer function is to be modelled as an analogue model or a discrete time model, and data indicating whether said transfer function is to be modelled directly or as parallel banks of cascaded biquadratic sections.

10. Apparatus as claimed in claim 9, wherein said corresponding header file further comprises:

the filename for said infinite impulse response filter polynomial coefficient data, the creation date and time for said infinite impulse response filter polynomial coefficient data, the file type of said infinite impulse response filter polynomial coefficient data, the originating process that produced said infinite impulse response filter polynomial coefficient data, the project name related to said infinite impulse response filter polynomial coefficient data, explanatory text relating to said infinite impulse response filter polynomial coefficient data, the name of the originator of said infinite impulse response filter polynomial coefficient data, the number of cascaded biquadratic sections in each parallel branch if said transfer function is so modelled, the number of parallel branches if said transfer function is so modelled, data indicating whether said polynomial coefficient data are integers and the sample rate specification of said infinite impulse response filter.

11. Apparatus as claimed in claim 1, wherein at least one of said application data files includes digital frequency response data comprising a plurality of frequency response data values and wherein said corresponding header file comprises:

the number of dimensions of said digital frequency response data, the sampling rate in each dimension of said digital frequency response data, and the number of frequency response data values in each dimension.

12. Apparatus as claimed in claim 11, wherein said corresponding header file further comprises:

the filename for said digital frequency response data, the creation date and time for said digital frequency response data, the file type of said digital frequency response data, the originating process that produced said digital frequency response data, the project name related to said digital frequency response data, explanatory text relating to said digital frequency response data, the name of the originator of said digital frequency response data, the end points in each dimension of said digital frequency response data, the type of distribution in each dimension of said digital frequency response data.

13. Apparatus as claimed in claim 1, wherein said at least one header file further includes data of previous manipulations performed upon said corresponding application data file.

14. Apparatus as claimed in claim 1, wherein said apparatus further includes common data and header file reading and writing means that reads from and writes to said application data file storage means and reads from and writes to said header file storage means in accordance with said selected signal processing operation.

15. Apparatus as claimed in claim 1, wherein said at least one header file includes at least one blank field to provide for further attributes to be specified.

16. Apparatus as claimed in claim 1, wherein each said application data file and each said corresponding header file form a composite file with said header file being located at the start of said composite file.

17. A method of designing, analyzing or simulating signal processing operations, said method comprising the steps of:

storing at least one application data file containing application data available to be processed;

storing at least one header file, each corresponding to a respective one of said application data files and each containing a plurality of attributes associated with application data of said corresponding application data file;

selecting at least one of said application data files to be read in its entirety for a signal processing operation;

selecting one of a plurality of different signal processing operations to be performed using the application data read in its entirety from said selected application data file;

selecting a set of attributes from the plurality of attributes read in its entirety from the header file corresponding to said selected application data file, said selected set of attributes being only those necessary to perform said selected signal processing operation, said selected set of attributes being smaller than said plurality of attributes; and performing said selected signal processing operation using the application data read in its entirety from said selected application data file.

18. Apparatus for designing, analyzing or simulating signal processing functions, said apparatus comprising:

application data file storage means for storing a plurality of application data files each containing application data available to be processed, said application data files respectively comprising digital video signal data comprising a plurality of video data elements, digital audio data comprising a plurality of audio data values, digital finite impulse response filter coefficient data comprising a plurality of finite impulse response filter coefficient values, infinite impulse response filter data representing a transfer function of a first polynomial divided by a second polynomial, and digital frequency response data comprising a plurality of digital frequency response data values;

header file storage means for storing a plurality of header files, each corresponding to one of said application data files and each containing a plurality of attributes associated with said application data of said corresponding application data file;

application data file selection means for selecting at least one of said application data files to be read in its entirety for a signal processing operation;

signal processing operation selection means for selecting one of a plurality of signal processing operations, said signal processing operations including analyzing the response of a finite impulse response filter, analyzing the response of an infinite impulse response filter, convolving two one-dimensional filters into a two-dimensional filter, filtering video image data, taking the difference of two video images, scaling the difference of two video images, and spectral analysis; and signal processing means for performing said selected signal processing operation using the application data read in its entirety from said selected application data file and for selecting a set of attributes from the plurality of attributes read in its entirety from the header file corresponding to said selected application data file, said selected set of attributes being only those necessary to perform said selected signal processing operation, said selected set of attributes being smaller than said plurality of attributes.

19. A method of designing, analyzing or simulating signal processing functions, said method comprising the steps of:

storing a plurality of application data files each containing application data available to be processed, said data application files respectively comprising digital video signal data comprising a plurality of video data elements, digital audio data comprising a plurality of audio data values, digital finite impulse response filter coefficient data comprising a plurality of finite impulse response filter coefficient values, infinite impulse response filter data representing a transfer function of a first polynomial divided by a second polynomial, and digital frequency response data comprising a plurality of digital frequency response data values;

storing a plurality of header files, each corresponding to one of said application data files and each containing a plurality of attributes associated with said application data of said corresponding application data file;

selecting at least one of said at least one application data files to be read in its entirety for a signal processing operation;

selecting one of a plurality of signal processing operations, said signal processing operations including analyzing the response of a finite impulse response filter, analyzing the response of an infinite impulse response filter, convolving two one-dimensional filters into a two-dimensional filter, filtering video image data, taking the difference of two video images, scaling the difference of two video images and spectral;

selecting a set of attributes from the plurality of attributes read in its entirety from the header file corresponding to said selected application data file, said selected set of attributes being only those necessary to perform said selected signal processing operation, said selected set of attributes being smaller than said plurality of attributes; and performing said selected signal processing operation using the application data read in its entirety from said selected application data file.

* * * * *